(12) United States Patent
Thorbeck et al.

(10) Patent No.: US 11,183,989 B1
(45) Date of Patent: Nov. 23, 2021

(54) ELECTRICAL CIRCUITS FOR LEAKAGE REDUCTION UNITS

(71) Applicant: International Business Machines Corporation, Armonk, NY (US)

(72) Inventors: Ted Thorbeck, Elmsford, NY (US); Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/063,879

(22) Filed: Oct. 6, 2020

(51) Int. Cl.
*H03H 11/04* (2006.01)
*G06N 10/00* (2019.01)

(52) U.S. Cl.
CPC ............. *H03H 11/04* (2013.01); *G06N 10/00* (2019.01)

(58) Field of Classification Search
None
See application file for complete search history.

(56) References Cited

U.S. PATENT DOCUMENTS

| | | | |
|---|---|---|---|
| 9,059,707 | B2 | 6/2015 | Gambetta et al. |
| 9,369,133 | B2 | 6/2016 | Naaman et al. |
| 9,432,024 | B2 | 8/2016 | Chow et al. |
| 10,422,607 | B2 | 9/2019 | Barends |
| 10,483,980 | B2 | 11/2019 | Sete et al. |
| 10,560,103 | B2 | 2/2020 | Reagor et al. |
| 2019/0007051 | A1* | 1/2019 | Sete ........................ G06N 10/00 |
| 2019/0385673 | A1 | 12/2019 | Bosman et al. |
| 2019/0392344 | A1* | 12/2019 | Kelly ...................... G06N 10/00 |

(Continued)

FOREIGN PATENT DOCUMENTS

WO    2020068237 A1    4/2020

OTHER PUBLICATIONS

Ribeiro et al, paper, entitled, "Systematic Magnus-based approach for suppressing leakage and non-adiabatic errors in quantum dynamics", submitted on Oct. 4, 2016 and published in Phys. Rev. X 7, 011021 (2017), 24 pages.

(Continued)

*Primary Examiner* — Lincoln D Donovan
*Assistant Examiner* — Khareem E Almo
(74) *Attorney, Agent, or Firm* — Amin, Turocy & Watson, LLP

(57) ABSTRACT

A system resets leakage states of a superconducting qubit to a qubit subspace by using a dedicated electrical circuit on a timescale faster than a natural decay process. One system comprises a qubit including a qubit transition frequency and multiple qubit leakage transition frequencies; and a filter circuit coupled to the qubit for leakage mitigation based on the qubit frequency and the multiple qubit leakage transition frequencies, wherein the filter circuit causes dissipation at the leakage transition frequencies while isolating the qubit transition frequency. Another system comprises a qubit including a qubit transition frequency and multiple qubit leakage transition frequencies; and a tunable dissipative cavity circuit coupled to the qubit for leakage mitigation based on the qubit frequency and the multiple qubit leakage transition frequencies, wherein the tunable dissipative cavity circuit causes the leakage transition frequencies to dissipate while isolating the qubit transition frequency.

16 Claims, 10 Drawing Sheets

(56) References Cited

U.S. PATENT DOCUMENTS

2021/0049495 A1* 2/2021 King ............... G06N 20/00

OTHER PUBLICATIONS

Aliferis et al., "Fault-Tolerant Quantum Computation for Local Leakage Faults" Quant. Inf. Comp. 7, 139-156 (2007), 15, pages.

Campagne-Ibarcq, et al. "Persistent Control of a Superconducting Qubit by Stroboscopic Measurement Feedback" PRX 3, 021008 (2013), 7 pages.

Egger, et al. "Pulsed reset protocol for fixed-frequency superconducting qubits" PRApp 10, 044030 (2018), 7 pages.

Fowler. "Coping with qubit leakage in topological codes" PRA 88, 042308 (2013), 5 pages.

Ghosh et al., "A leakage-resilient approach to fault-tolerant quantum computing with superconducting elements" PRA 91, 020302(R) (2015), 6 pages.

Hsu, et al. "Tunable refrigerator for non-linear quantum electric circuits" arXiv:2002.06867 (2020), 21 pages.

Johnson, et al. "Heralded state preparation in a superconducting qubit" PRL 109 ,050506 (2012), 5 pages.

Magnard, et al. "Fast and Unconditional All-Microwave Reset of a Superconducting Qubit" PRL 121, 060502 (2018).

Murch, et al. "Cavity-assisted quantum bath engineering" PRL 109, 183602 (2012), 11 pages.

Reed, et al. "Fast Reset and Suppressing Spontaneous Emission of a Superconducting Qubit" APL 96, 203110 (2010), 4 pages.

Salathe, et al. "Low-Latency Digital Signal Processing for Feedback and Feedforward in Quantum Computing and Communication" PRApp 9, 034011 (2018), 20 pages.

Tan, et al. "Quantum-circuit refrigerator" Nat Commun 8, 15189 (2017), 8 pages.

Tuorila, et al. npj QI 3, 27 (2017).

Varbanov, et al. arXiv:2002.07119 (2020).

Wallraff PRL 99, 5 (2007).

* cited by examiner

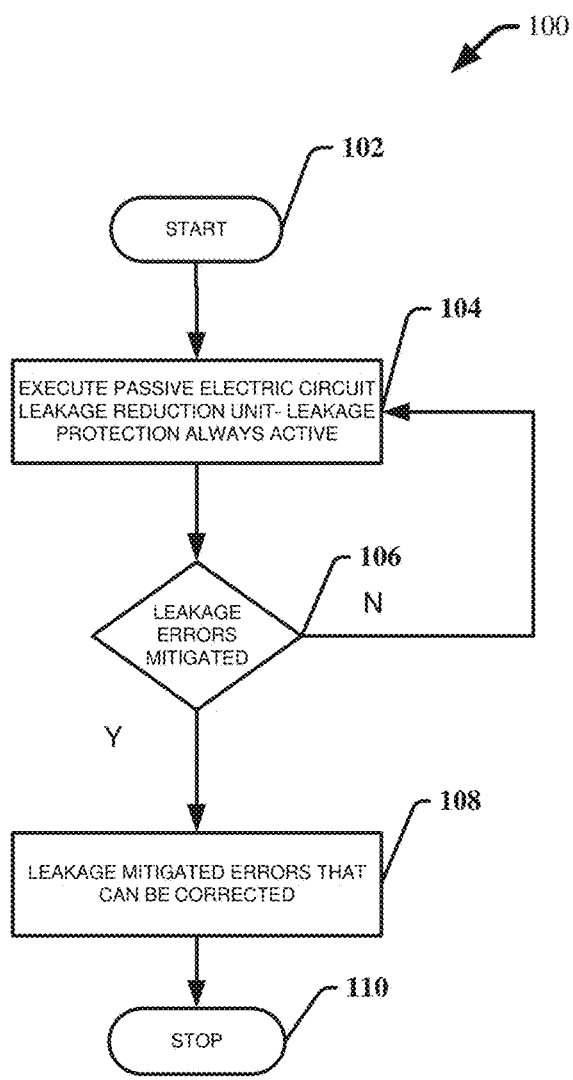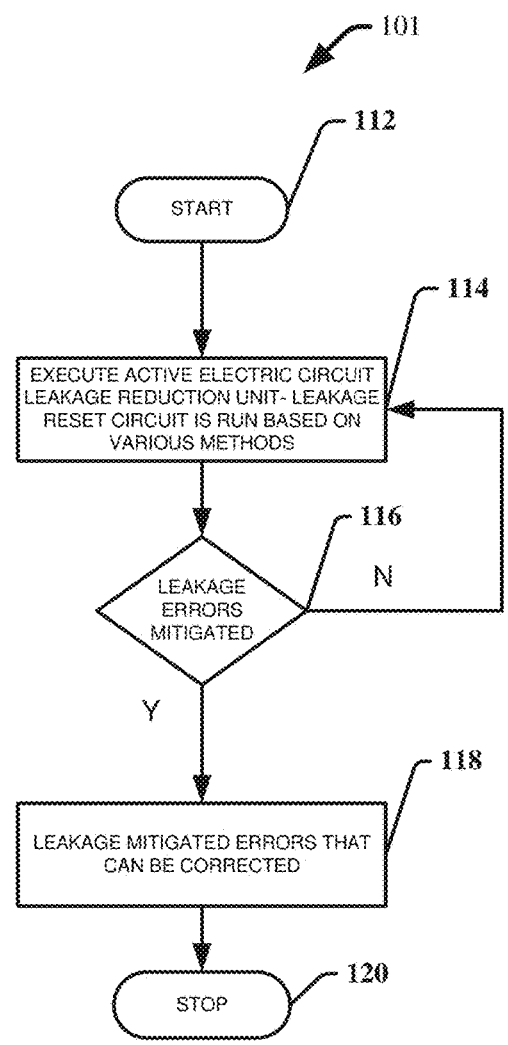
FIG. 1A
FIG. 1B

ELECTRICAL CIRCUITS FOR LEAKAGE REDUCTION UNITS

TECHNICAL FIELD

The subject disclosure relates to resetting the leakage states of a superconducting qubit to a qubit subspace on a timescale faster than a natural decay process using a dedicated electrical circuit. The dedicated electrical circuit couples the leakage states to a dissipation channel while protecting the qubit state.

BACKGROUND

Quantum computing is generally use of quantum-mechanical phenomena to perform computing and information processing functions. Quantum computers operate on quantum bits that comprise superpositions of both 0 and 1, can entangle multiple quantum bits, and use interference. A qubit (e.g., quantum binary digit) is a quantum-mechanical analogue of a classical bit. Superconducting qubits offer a promising path towards constructing fully-operational quantum computers as they can exhibit quantum-mechanical behavior (e.g., facilitating quantum information processing) at a macroscopic level. Superconducting qubits are multi-level systems, and two lowest energy levels (0 and 1) constitute the qubit. One of the challenges in quantum computing is to protect quantum information (e.g., qubit state) and mitigate errors during dynamic quantum computation. Quantum Error Correction (QEC) coding scheme(s) have been developed to correct errors during quantum computation, however, conventional QEC algorithms struggle to correct leakage errors. If any state other than the two lowest energy superconducting qubit levels are occupied, then the qubit is said to have leaked out of the qubit subspace, which constitutes leakage error in a quantum computer. It is currently a challenge, employing conventional techniques, to reset the leakage states of a superconducting qubit to the qubit subspace in a timely manner.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate the generation of quantum adaptive execution method based on previous quantum circuits and its intermediate results.

In accordance with an embodiment, a system comprises a qubit including a qubit transition frequency and multiple qubit leakage transition frequencies; and a filter circuit coupled to the qubit for leakage mitigation based on the qubit frequency and the multiple qubit leakage transition frequencies, wherein the filter circuit causes the leakage transition frequencies to dissipate while isolating the qubit transition frequency.

In another embodiment, a system, comprises a qubit including a qubit transition frequency and multiple qubit leakage transition frequencies; and a tunable dissipative cavity circuit coupled to the qubit for leakage mitigation based on the qubit frequency and the multiple qubit leakage transition frequencies, wherein the tunable dissipative cavity circuit causes the leakage transition frequencies to dissipate while isolating the qubit transition frequency.

In accordance with an embodiment, a dedicated electrical circuit is used to reset leakage state of the qubit to a qubit subspace on a timescale faster than a natural decay process.

In an optional aspect, the tunable dissipative circuit can expose the qubit frequency to dissipation, thus performing qubit reset which returns the qubit to its ground state regardless of its current state.

In accordance with one or more embodiments, a method, comprises:
selecting, for a qubit, a qubit transition frequency and multiple qubit leakage transition frequencies; providing leakage mitigation based on the qubit transition frequency and the multiple qubit leakage transition frequencies by utilizing either: a filter circuit coupled to the qubit that causes leakage transitions to dissipate while isolating the qubit transition frequency; or a tunable dissipative cavity coupled to the qubit that causes leakage transitions to dissipate while isolating the qubit transition frequency.

It is to be appreciated that when a tunable dissipator is run, flux is changed through a Superconducting Quantum Interference Device (SQUID) loop in the dissipator, thus changing frequency of the dissipator. The frequency of the dissipator is swept through the leakage transition frequencies.

DESCRIPTION OF THE DRAWINGS

FIGS. 1A and 1B illustrate example flowcharts of methodologies employed in connection with an electrical circuit for leakage reduction (ECLR) wherein it resets leakage state of a superconducting qubit in a dedicated electrical circuit to a qubit subspace on a timescale faster than a natural decay process.

DETAILED DESCRIPTION

Figure 2:
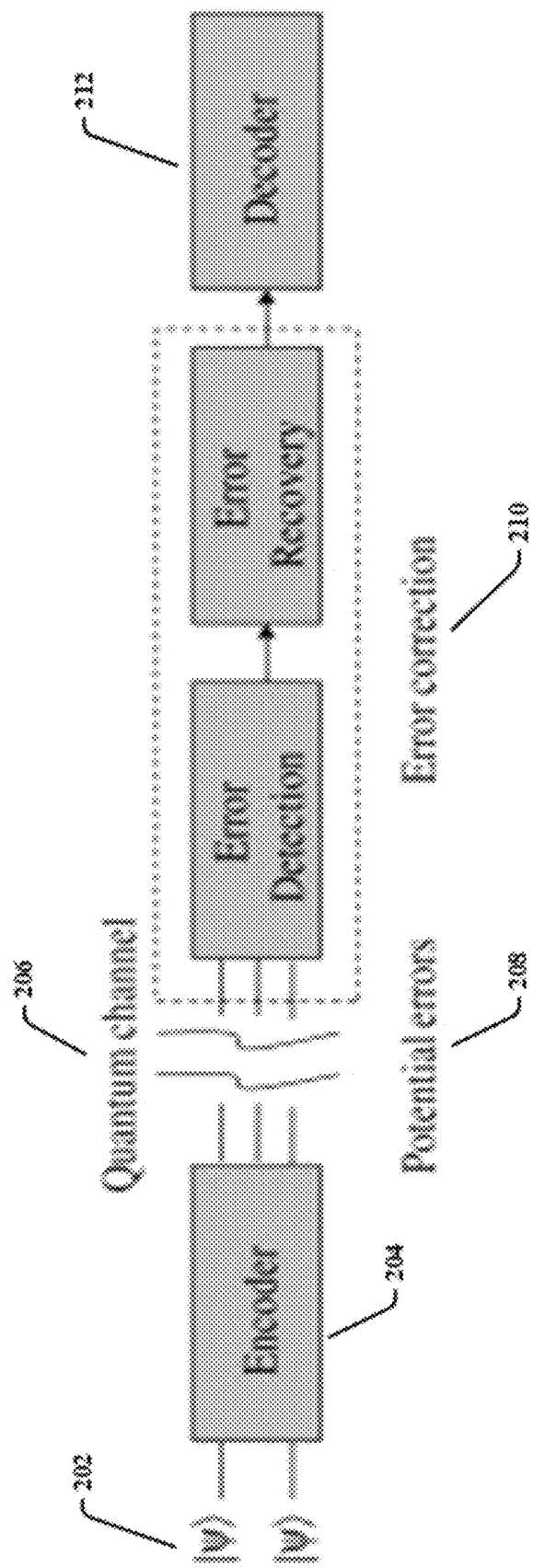
FIG. 2 illustrates an example of a Quantum Error Correction (QEC) principle.

The following detailed description is merely illustrative and is not intended to limit embodiments and/or application or uses of embodiments. Furthermore, there is no intention to be bound by any expressed or implied information presented in the preceding Summary section, or in the Detailed Description section. One or more embodiments are now described with reference to the drawings, wherein like reference numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

The subject disclosure relates generally to systems and methods that reset the leakage states of a superconducting qubit to the qubit subspace by using a dedicated electrical circuit on a timescale faster than a natural decay process. Embodiments disclosed herein can use a dedicated electrical circuit that couples the leakage states to a dissipation channel while protecting the qubit state. Embodiments comprise a qubit at a qubit frequency and multiple leakage transition frequencies. The dedicated electrical circuit reset the leakage in the qubit. These embodiments propose aspects to create the Leakage Reduction Unit (LRU) using electric circuits. A first aspect employs a filter circuit that exposes leakage transitions to dissipation while isolating qubit transition, and a second aspect employs a tunable, dissipative cavity coupled to the qubit to reset the leakage state.

In today's digital world, data plays a prime factor in many applications. Action(s) taken can often leave digital footprints through satellite images, bio-medical fields, smartphones, social media, and other applications. Rapidly growing technology has led to exponential increase in machine-generated data. Big Data represents a new era in data exploration and utilization such that it contains data high in volume, variety and velocity. Modern advances in software engineering have led to deploying software as services (e.g., SaaS), which provides significant advantage for organizations to focus on core businesses instead of expanding resources on computer infrastructure and maintenance. For example, 'big-data' clustering software as a service employs a set of data instances as input, can perform computations for data clustering and return partitioned data to a client as an output. Big data can be used in many scenarios for data mining such as for example tracking generated content in social media, analyzing web page images from the web and census data, obtaining required data from Internet of Things (IoT) sensors, and activity tracking from smartphones and network traffic data for cyber-security. As big data becomes ubiquitous in data analytics, demand for data sampling and data dimension features rapidly grow. Thus, as an essentially primitive, quantum computing is receiving ever increasing attention.

Quantum computing is generally use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference. Superconducting qubits offer a promising path towards constructing fully-operational quantum computers as it can exhibit quantum-mechanical behavior (allowing to be used for quantum information processing) at a macroscopic level (e.g., designed and fabricated by existing integrated circuit technologies). Quantum computation uses a qubit as its essential unit instead of a classical computing bit. The qubit (e.g., quantum binary digit) is a quantum-mechanical analog of a classical bit. Whereas classical bits can employ on only one of two basis states (e.g., 0 or 1), qubits can employ superpositions of those basis states (e.g., $a|0>+(\beta|1>$, where $\alpha$ and $\beta$ are complex scalars such that $|\alpha|^2+|\beta|^2=1$), allowing several qubits to theoretically hold exponentially more information than a same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, etc. Qubits, partaking of the quantum mystique, can occupy a superposition of 0 and 1 states. It's not that the qubit can have an intermediate value, such as 0.63; when the state of the qubit is measured, the result is either 0 or 1.

Quantum computing has the potential to solve problems that, due to computational complexity, cannot be solved, either for many practical purposes, on a classical computer. Quantum programming is a process of assembling sequences of instructions, called quantum programs, that are capable of running on a quantum computer. A quantum program can have a collection of quantum circuits. When a quantum circuit is executed, a result is produced by the quantum computer. A quantum computer can interact with its surroundings, resulting in decoherence and decay of quantum information stored in the device. Decoherence may be prevented by perfectly isolating a computer from an environment; however, errors can still pose difficulties. Current methods that deal with leakage errors let leaked states naturally decay to qubit subspace. However, a natural lifetime of a leakage state is very long and thus the leakage states may persist for many error corrections cycles. Hence, these embodiments propose system(s) and method(s) that can use a dedicated electrical circuit that couples leakage state to a dissipation channel while protecting qubit state. In this way, resetting leakage state of a superconducting qubit in a dedicated electrical circuit to the qubit subspace happens faster than a natural decay process.

FIGS. 1A and 1B illustrate example methodologies employed in connection with an electrical circuit for leakage reduction (ECLR) wherein the ECLR resets leakage state of a superconducting qubit in a dedicated electrical circuit to a qubit subspace on a timescale faster than a natural decay process. A novel embodiment relates to creating a dedicated electrical circuit to reset leakage state of a superconducting qubit into qubit subspace on a timescale faster than a natural decay process. There are two implementation methods 100 and 101 when designing a device, one of these methods 100 or 101 will be chosen to be run and both methods will not be available on a same device. For a passive leakage reset circuit, the process 100 starts at block 102 wherein leakage protection is on in the background. The passive electric circuit will do its job regardless of whether a leakage is detected or not. A filter circuit exposes leakage transition to dissipation while isolating qubit transition. The filter circuit includes a response characteristic that passes at least one qubit leakage transition frequency to a dissipation channel while blocking the qubit frequency from a dissipation channel. If the leakage is mitigated, the errors can be corrected as denoted at block 108 using a traditional QEC code and thus completes the process at 110. Alternatively, the second implementation method 101 starts at 112 wherein the active leakage reset circuit can be chosen to run the leakage reset circuit. An active ECLR 114 is used where a tunable dissipative cavity is coupled to a qubit to reset leakage states. The tunable cavity includes a response characteristic that is configured to be tuned across a plurality of qubit leakage transition frequencies to a dissipation channel while blocking the qubit frequency from the dissipation channel. The tunable cavity comprises a Superconducting Quantum Interference Device (SQUID) tunable qubit. This method 101 would likely run the active reset circuit on qubits wherein the qubit leakage is undetected. Thus, it is advantageous to have the leakage reset circuit not disrupt the qubit state. If leakage detection is employed, then upon execution, if leakage is not mitigated at 116, the execution is continued at 114. If leakage errors are mitigated, then the errors can be corrected using traditional QEC codes at 118 to complete the process at 120. For example, at the start of an experiment we could run the leakage reset circuit to initialize the device. In that case, it applies to all qubits in the circuit, and thus it is not important to know whether the qubit has leaked. However, in the middle of running an algorithm, it may be desired to run the leakage reset circuit without knowing if the qubit has leaked. This is because it is difficult to detect leakage without projecting the qubit and destroying quantum information. There are many advantages of the active embodiment because it is fast, protects qubit state and is capable of resetting leakage in a few hundred nanoseconds, whereas for the passive embodiment resets can take several microseconds. Thus, there are two novel embodiments, the first embodiment utilizes a filter device that is coupled to the qubit and the second embodiment has a tunable cavity that is coupled to the qubit. There are several different methods to detect a leakage. The simplest method is to measure the qubit, and in dispersive readout the leakage states that are distinct from the 0 and 1 state. However, during a quantum experiment, qubit measurement is often forbidden and thus it is difficult to detect leakage. As a result, during quantum computing, a leakage is often not detected and thus these methodologies will assist to mitigate leakage whether or not leakage detection is employed.

Controlling dynamics of quantum systems poses challenges based on capabilities of the physical realization of a quantum computer. Studies have been conducted to determine solutions that promises ideal environment(s) for universal quantum computation. A universal quantum computer can process information in modern quantum technology which uses quantum bits (also known as qubits) and quantum circuits to perform quantum computations. Error in quantum computation is one of the main challenges that is currently faced in quantum computing and thus the field of Quantum Error Correction (QEC) has been developed to correct these errors. A (QEC) protocol plays a major role in quantum computing where choice of error correction code can influence a full quantum computing stack, from layout of qubits to gate compilations. QEC protects information stored in two-level quantum systems (qubits) by rectifying errors with operations conditioned on measurement outcomes. A qubit consists of an idealized pair of orthonormal quantum states. Even though QEC codes are widely beneficial in error detection, they have difficulties in correcting leakage errors. If any other state than the two lowest energy levels 0 and 1 that constitute the qubit is occupied, the qubit is said to have leaked out of qubit subspace. Leakage may be the result of application of gate operations, or induced by system interactions. QEC codes can correct leakage errors if a Leakage Reduction Unit (LRU) is used. An LRU is a device that corrects leakage error by returning quantum state to qubit subspace. It converts leakage on a single qubit into a regular error. Conventional methodologies to account for leakage errors typically let leaked states naturally decay to the qubit subspace. A problem is that this natural lifetime of leakage states is often very long and thus leakage states can persist for numerous error corrections cycles. Embodiments described and claimed herein disclose employment of a dedicated electrical circuit that couples leakage state to a dissipation channel while protecting qubit state. These embodiments employ such dedicated electrical circuit ((Electrical Circuit for Leakage Reduction (ECLR)) to reset leakage state of a superconducting qubit into qubit subspace on a timescale faster than a natural decay process. The ECLR is an electrical circuit of a Leakage Reduction Unit (LRU). There exists a threshold for leakage errors if an LRU is used. An ECLR would implement an LRU with a dedicated electrical circuit thus facilitating building a quantum computer with superconducting qubits. A first embodiment consists of a filter circuit that exposes the leakage transitions to dissipation while isolating qubit transition. The first embodiment includes a passive ECLR circuit that exposes the leakage transition to dissipation while isolating qubit transition. The second embodiment consists of a tunable, dissipative cavity coupled to a qubit to reset leakage states. In this second embodiment, an active ECLR circuit is used to connect various leakage transition to dissipation. Thus, novelty of these embodiments includes incorporating an electric circuit to dissipate the leakage, by bringing the qubit back to the qubit subspace such that the error is translated to an error that can be addressed using QEC codes.

The components in architectures described herein can control the tunable dissipator with current providing magnetic flux through a SQUID. A voltage can be used to tune a resonator using, for example, Micro-Electromechanical System (MEMS), piezoelectric effects, or semiconducting switches. Alternatively, the resonator and the leakage transitions can be coupled parametrically by applying microwave signals to the SQUID loop. Moreover, the aforementioned systems and/or devices have been described with respect to interaction between several components. It may be appreciated that such systems and components can include these components or sub-components specified therein, some of the specified components or sub-components, and/or additional components. Sub-components may also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art. Components can be hardware, software or a combination thereof.

The subject computer processing systems, methods apparatuses and/or computer program products can be employed to solve new problems that arise through advancements in technology, computer networks, the Internet and the like.

A quantum program can have a collection of quantum circuits. When a quantum circuit is executed, a result is produced by the quantum computer. A quantum computer uses a qubit as its essential unit instead of a classical computing bit. The qubit is the quantum-mechanical analog of the classical bit. Quantum computers (e.g., computers that employ qubits instead of solely classical bits) can, in theory, quickly solve some problems that may be extremely difficult for classical computers. By processing information using the laws of quantum mechanics, quantum computers offer novel ways to perform computation tasks such as molecular calculations, financial risk calculations, optimization, and many more. Quantum computers are a sophisticated technology that are difficult to engineer, build and program. As a result, quantum computers experience errors in the form of noise, faults and loss of quantum coherence, thus protecting quantum information from errors is essential for large-scale quantum computation. Large-scale quantum information processing hinges on overcoming errors from environmental noise and imperfect quantum operations. Errors in quantum computation is one of the main challenges that is currently faced in quantum computing and thus the field of Quantum Error Correction (QEC) has been developed to correct these errors However, leakage is a difficult error for QEC algorithms to correct, this is why an implementation of a Leakage Reduction Unit (LRU) as an electrical circuit would be very useful.

FIG. 2 illustrates an example of Quantum Error Correction (QEC) that can play a major role in quantum computing where choice of error correction code can influence a full quantum computing stack, from layout of qubits to gate compilations. An application of Quantum Error Correction is protection of quantum information as it dynamically undergoes quantum computation. A quantum computer can inevitably interact with surroundings, resulting in decoherence, and hence there can be decay of quantum information stored in a device. QEC protects the information stored in two-level quantum systems (qubits) by rectifying errors with operations conditioned on measurement outcomes. Elements of QEC codes are shown in FIG. 2, wherein a QEC code consists of various aspects: encoding, error detection, error recovery and decoding. A QEC process is initiated with quantum state qubits 202 which passthrough an encoder 204. The encoder 204 adopts quantum information and encodes it in state $|\psi\rangle$ with help of local ancillary qubits $|0\rangle$ and sends encoded qubits over a noisy quantum channel 206. Based on potential errors detected at block 208, the QEC process is performed where detected errors are recovered at block 210. The results are decoded at the end of the QEC process at block 212. Quantum gates (in contrast to classical gates) are unitary transformations chosen from a continuum of possible values. Thus, quantum gates cannot be implemented with perfect accuracy; effects of small imperfections in the gates can accumulate, potentially leading to serious failure in computation. Any effective strategy to prevent errors in a quantum computer can protect against small unitary errors in a quantum circuit, as well as against decoherence.

Even though conventional QEC codes are widely beneficial in error detection, they often experience difficulties in correcting leakage errors. Also, superconducting qubits such as transmons are multilevel systems and only the two lowest energy levels (0 and 1) constitute the qubit. A transmon is an implantation of a superconducting qubit consisting of a Josephson junction and capacitor in parallel. A transmon has many energy levels, and only the lowest two are used as the qubit. Occupation of any of the other levels constitutes leakage; if any other state than the two lowest energy levels is occupied, then the qubit is said to have leaked out of the qubit subspace. QEC codes can correct leakage errors if a Leakage Reduction Unit (LRU) is used. An LRU is a device that corrects a leakage error by returning the quantum state to the qubit subspace. It converts leakage on a single qubit into a regular error. LRUs satisfy two properties wherein if the input is in the computational space then the identity operation is performed and if the input is in the leakage space then its output is some state in the computational space. Although the identity operation is an exemplary case, it is not necessary in these embodiments. Performing the sweep of the tunable dissipator will likely result in a rotation of the qubit around the z-axis. This will result in a change in the phase of the qubit. These embodiments can either cancel the rotation by applying a rotation in the opposite direction or track the change in phase of the qubit in bookkeeping. LRUs are building blocks to construct several possible leakages suppressing error-correction circuits in a toric code wherein a toric code is a topological quantum error correcting code. Toric code is one of many implementation methods of a QEC code. Leakage is currently a challenge in quantum computing and realistic implementation of an LRU would greatly benefit the quantum computing efforts.

Figure 3:
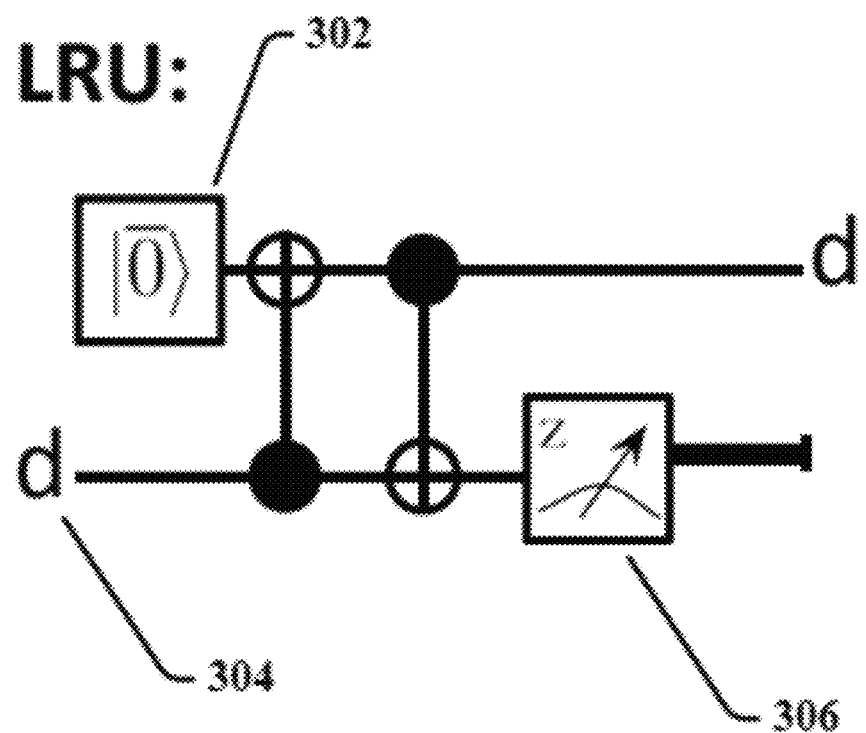
FIG. 3 illustrates an example of a Leakage Reduction Unit (LRU) implemented by one-bit teleportation.

FIG. 3 illustrates an example of a Leakage Reduction Unit (LRU) implemented by one-bit teleportation. In a quantum computer, leakage means when the superconducting qubit leaves a qubit subspace. Qubits generally stay in the subspace of states 0 and 1. Anytime a qubit drifts outside the 0 and 1 subspace, it needs to be reset back into the subspace. An LRU unit is composed of a qubit d as denoted by block 304 and the qubits function as either data qubits which are used to store encoded quantum states or ancilla qubits which are used to measure check operators of quantum code that is prepared in state $|0\rangle$ as denoted by block 302. Z-type check operators associate to faces (plaquettes) as denoted by block 306. The implementation of an LRU described above is a standard example. These embodiments propose another implementation method of an LRU. Conventionally proposed techniques have described methods of comprehending LRU's that have relied upon teleportation between qubits to convert leakage errors to classical faults. One such approach is to SWAP quantum information between data and ancilla bits which when combined with reset can mitigate leakage.

Conventional methods to deal with leakage errors typically allow leaked states to naturally decay to qubit subspace. As noted supra, a problem is that such natural lifetime of leakage states can be undesirably long and consequently leakage states can persist for many error corrections cycles. Another conventional approach to leakage mitigation is to minimize chance of leakage by, for example, decreasing power of drives applied to a device. However, such strategy slows down quantum computer operation. A problem of a leakage reset is distinct from, but related to, the problem of qubit initialization. Leakage reset returns a leaked state to qubit subspace, whereas qubit initialization (sometimes also referred to as a reset) returns a qubit from any state within qubit subspace to a known state, typically the ground state. There are many methods to improve initialization of the qubit such as measurement and feedback, microwave-induced transitions, tuning qubits into fixed dissipative modes, tuning a dissipative mode into the qubit, and quantum circuit refrigerator. An effect of some of these methods of initialization on $|2\rangle$ state has been discussed in the literature, where $|2\rangle$ is the lowest of leaked states. Also, previous state of the art implementations of qubit reset that include limited leakage reset include combining a microwave drive at $|1\rangle$-$|2\rangle$ transition and a two-photon drive to swap the $|2\rangle$ state to a readout resonator where an excitation may decay quickly. This conventional method can struggle to reset leakage beyond the $|2\rangle$ state because higher leakage transitions can drift in frequency because of charge offset drift. Also, in conventional techniques, a quantum circuit refrigerator has been shown to reset the $|2\rangle$ state in numerical calculations. Ideally, leakage reset methods would reset any leaked state back into the qubit subspace and would not disturb a qubit that is in the qubit subspace. However, both of the conventional methods described above may destroy the quantum state if the qubit is in the qubit subspace.

As noted, novel embodiments described and claimed herein propose employing a dedicated electrical circuit that couples leakage state to a dissipation channel while protecting qubit state. These embodiments create a dedicated electrical circuit to reset leakage state of a superconducting qubit into the qubit subspace on a timescale faster than a natural decay process.

Figure 4:
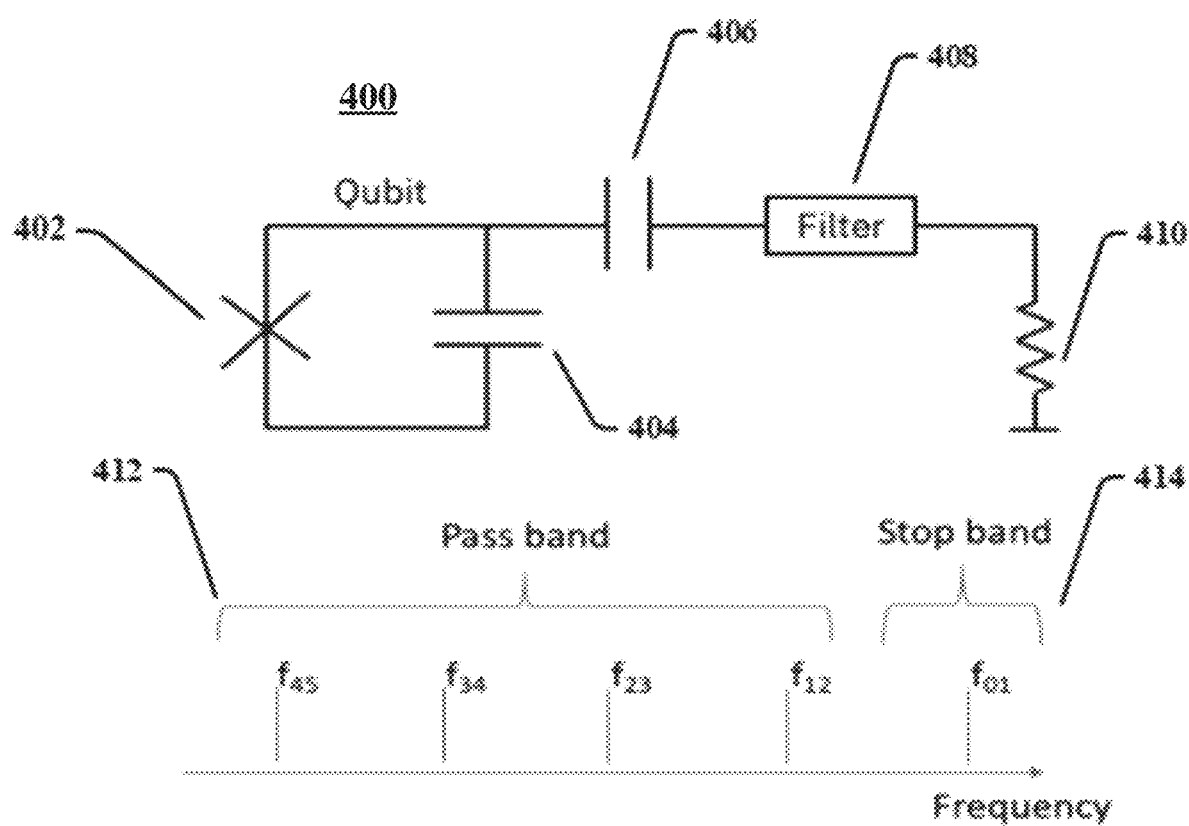
FIG. 4 illustrates an example of the first implementation method that employs a filter circuit to expose leakage transitions to dissipation while isolating qubit transition.

FIG. 4 illustrates an example of the first embodiment (FIG. 1) that consists of a passive ECLR circuit 400 that exposes the leakage transitions to dissipation while isolating qubit transition. The circuit 400 includes X 402 (which represents a Josephson junction) and capacitor 404. The qubit is a combination of 402 and 404. The qubit is coupled (via capacitor 406) to filter 408. The filter is connected to a dissipation component, here shown as a resistor 410. A qubit, shown here as a transmon, can be any suitable superconducting qubit. Transmons have a negative an harmonicity, resulting in a frequency transition spectrum denoted by blocks 412 and 414 depicted as pass band and stop band frequencies. As denoted at 412, there are a set of leakage transitions ($f_{12}$, $f_{23}$, $f_{34}$, $f_{45}$) to which when power is applied at these frequencies, the qubit can migrate out of subspace into leakage space. Dissipation that is shown as resistor 410 can also be a lossy capacitor or a transmission line. Coupling shown to be capacitor 406 can be inductive, galvanic, or achieved through another suitable mode, e.g., a bus resonator or a readout resonator. The filter 408 has a stopband that blocks the qubit frequency ($f_{01}$) 414 and passband that passes the leakage transition frequencies ($f_{12}$, $f_{23}$, $f_{34}$, $f_{45}$) 412. For a transmon, this can be realized in form of a band-stop filter around $f_{01}$, a bandpass filter around leakage transitions $f_{12}$, $f_{23}$, $f_{34}$, $f_{45}$, or a low-pass filter below $f_{01}$. In a qubit with positive an harmonicity (e.g., such as a capacitive-shunted flux qubits (CSFQ)), this can be a band-stop filter around $f_{01}$, a band-pass filter around leakage transitions or a high-pass filter above $f_{01}$. An additional capability in such embodiments is to frequency tune filter bands such that the leakage reset filter 408 can be turned on and off. The filter 408 can be tuned when the qubit needs to reset, and the filter 408 can be switched to make stop band $f_{01}$ be in pass band. The filter 408 can also be tuned to make it work for any suitable type of qubit in the circuit 400. It is to be appreciated that in a non-limiting implementation, a single filter can be connected to multiple qubits as a cascade connection. A qubit can have its respective filter and can also control filter dependency based on other qubits.

Figure 5:
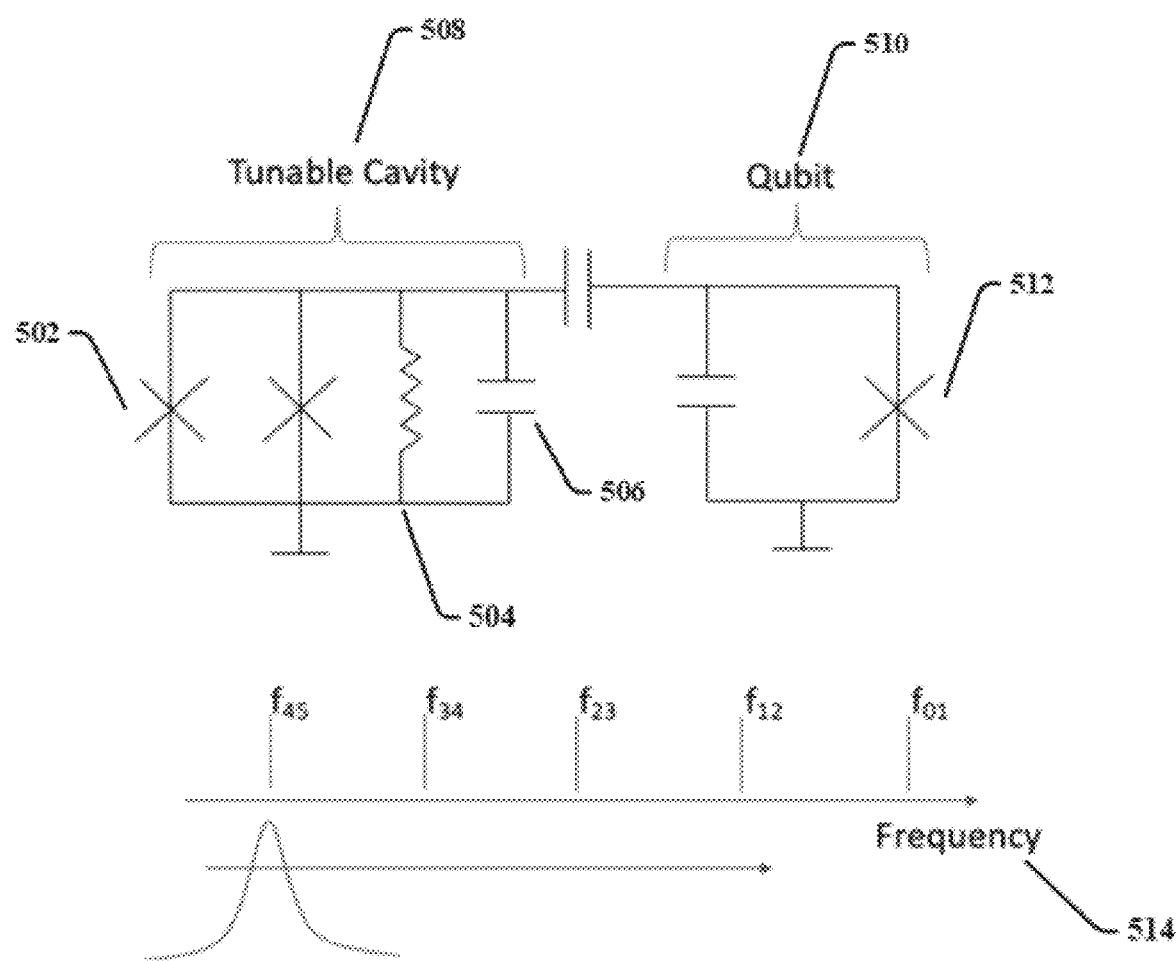
FIG. 5 illustrates an example of an implementation that comprises a tunable, dissipative cavity coupled to a qubit to reset leakage states.

FIG. 5 illustrates an example of the second implementation aspect which consists of a tunable, dissipative cavity coupled to a qubit to reset leakage states. In this aspect, a goal is to connect various leakage transition to dissipation. The qubit 510, shown here as a transmon is represented as a Josephson junction 512 in parallel with the capacitor 516. This qubit is capacitively coupled to a tunable dissipator 508 and it is shown as a flux tunable dissipative mode. The tunable cavity 508 is shown as a SQUID tunable qubit with an added resistor to create dissipation. The tunable cavity could either be lumped element or transmission line based. Dissipation could be created with on-chip, with a resistor or a lossy capacitor, or off-chip with an external transmission line. A qubit, here shown as a transmon 512, can be any suitable superconducting qubit. A coupler unlabeled, shown as a direct capacitive coupling, can be inductive, galvanic, or coupled through a bus. A Superconducting Quantum Interference Device (SQUID) consists of two Josephson junctions in parallel. The effective inductance of the SQUID can be changed by tuning the magnetic flux through the SQUID loop. By changing the effective inductance of the SQUID, the frequency of the dissipative mode change be changed. When the dissipative mode is in resonance with a leakage transition, an excitation can be swapped from the qubit to the tunable cavity where it can be quickly dissipated.

Figure 6:
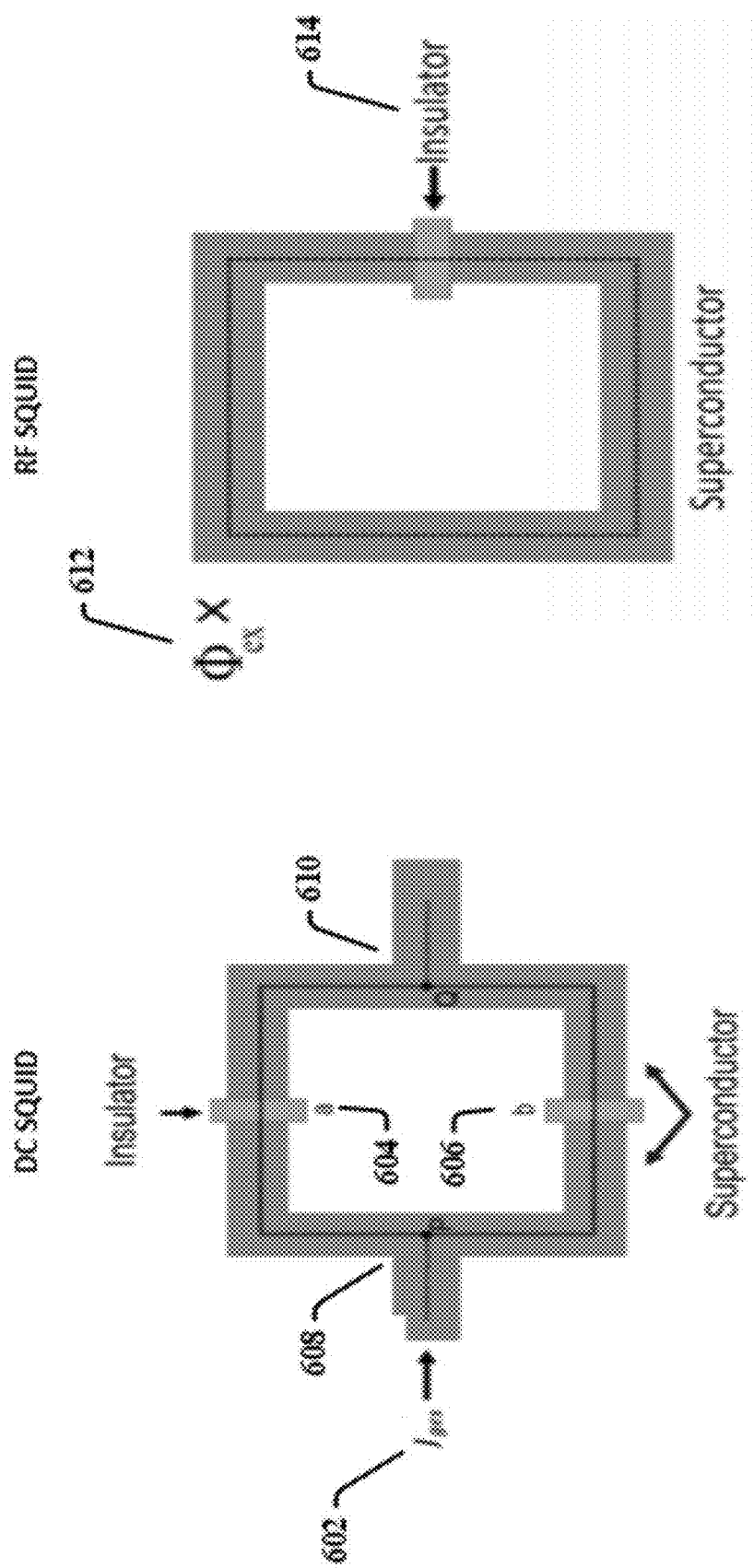
FIG. 6 illustrates an example of a Superconducting Quantum Interference Device (SQUID).

FIG. 6 illustrates an example of a Superconducting Quantum Interference Device (SQUID) 602 using a device called a Josephson junction. A DC SQUID can be made up of two Josephson junctions a 604 and b 606 connected in parallel. The two Josephson junctions 604 and 606 can be applied to a loop between points P 608 and Q 610. As opposed to the DC SQUID, which has two junctions a 604 and b 606, an RF (Radio Frequency) SQUID can be composed of just one junction. To fully account for behavior of the RF SQUID, the inductance of a Josephson Junction in an external field and the flux through the loop due to external magnetic fields for both the DC and the RF SQUID needs to be considered. A one-junction superconducting loop in an external magnetic field is placed in an external flux $\Phi_{ex}$ X as 612 with an insulator 614. The RF SQUID is a one-junction SQUID loop that can be used as a magnetic field detector. Although it is less sensitive than the DC SQUID, it is less expensive and easier to manufacture and is, therefore, more commonly used. In the RF SQUID, the one-junction superconducting loop is coupled to a circuit driven by an RF current source, such that the loop experiences flux produced by current ($\Phi_{RF}$). In FIG. 5, the tunable cavity 508 is swept from low frequencies to higher frequencies. When the tunable cavity 508 is at the same frequency as a leakage transition, an excitation from the cavity swaps from the transmon to the cavity where it is quickly dissipated by the resistor 504. For instance, if the qubit 510 starts in a $5^{th}$ excited state (a leakage state), then the qubit may be reset to qubit subspace through the $f_{5-4}$, $f_{4-3}$, $f_{3-2}$, $f_{2-1}$ transitions sequentially as denoted by block 514. This can be accomplished in a few hundred nanoseconds, which is faster than natural decay which would require something on the order of a millisecond in conventional devices and longer in future devices. To protect qubit state while emptying leaked states, bandwidth of the lossy cavity may be relatively small (e.g., smaller than the separation between $f_{12}$ and $f_{01}$). This solution can also be used to reset qubit state to ground by flux-tuning resonance frequency of the lossy cavity to be in resonance with $f_{01}$. Thus, the flux through the SQUID loop changes frequency of the cavity.

Figure 7:
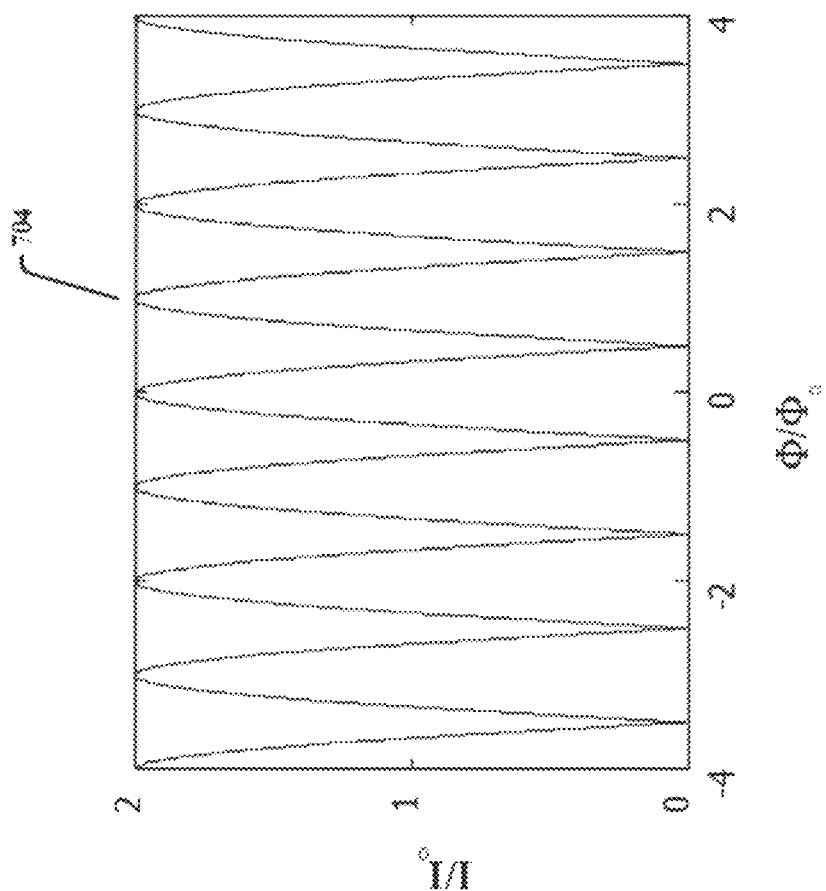
FIG. 7 illustrates an example of Superconducting Quantum Interference Device (SQUID) schematically described by a superconducting loop with two weak links.
Figure 7:
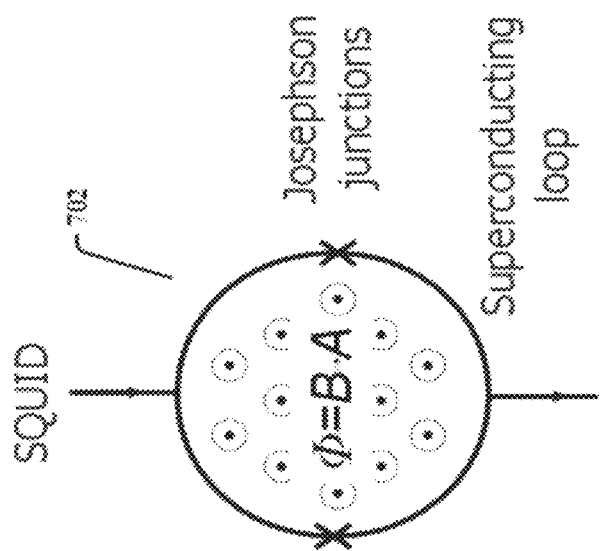

FIG. 7 illustrates an example Superconducting Quantum Interference Device (SQUID) schematically described by a superconducting loop with two weak links. A complex superconducting order parameter, $\psi(r)=|\psi(r)|e^{i\varphi(r)}$, has to be single-valued and phase of the order parameter may change by a multiple of $2\pi$ around the loop. This results in quantization of flux in the loop in units of flux quantum $\Phi_0$=hc/2e=20.7 [Gauss $\mu m^2$]. The flux through an unbroken superconducting loop is quantized, but the Josephson junctions break the loop. An external flux is applied through the loop to control the effective inductance of the Josephson junction. Thus, properties of the SQUID loop 702, including critical current and resistance, become periodic with flux in the loop. A maximal current that can flow in the SQUID without dissipation is periodic in flux in the loop $I_c(\Phi)$ =$I_0|\cos(\pi\Phi/\Phi_0)|$ as denoted by block 704. By sweeping the flux, a dissipative mode can be cleaned through leakage transitions. Thus, in embodiments, flux capability is shown as two Josephson junctions in parallel which creates the SQUID loop, and then a resistor serves as dissipation. This creates a flux tunable dissipative mode as shown in FIG. 7. Flux tuning means that it can change frequency of that dissipative mode and this can be performed by sweeping frequency of the dissipative mode through leakage transition—this can connect leakage transition to dissipation mode and then perform leakage reset.

Leakage reset is desirable because quantum computers are built based on superconducting qubits and these qubits can generate substantial errors; some errors are easier to correct than others. There are various methods of performing error correction associated with errors that occur within qubit subspace. Quantum error correcting (QEC), like the surface codes, cannot correct errors that involve leakage, which is when a qubit leaves qubit subspace. Prior work theoretically proved that if there were methods that can perform leakage reset then leakage errors can be converted into regular qubit errors and it becomes efficient for quantum algorithms to correct regular qubit errors. In simple terms, if leakage errors are converted into regular errors, a quantum algorithm can handle these errors. Mitigation happens by correcting errors when it occurs as supposed to preventing errors to occur. Thus, by incorporating an electric circuit to dissipate the leakage, and bring it to the qubit subspace such that the error is translated to an error that can be handled is a novelty of embodiments described and claimed herein.

Conventional methods that are used to let any leakage decay back to qubit subspace via natural lifetime of leakage states are typically very long and thus any leakage may persist for numerous error corrections cycles. Conventionally mitigating leakage involves replacing a leaked qubit with a new un-leaked qubit (through teleportation or a SWAP), whereas novel embodiments disclosed and claimed herein employ an electrical circuit to correct leakage errors. An aspect of active reset that involves sweeping a dissipative mode through the leakage transitions is similar to a corresponding aspect of qubit initialization that uses a tunable dissipative mode to tune into resonance at $f_{01}$ to reset a qubit to ground state. Thus, by using an LRU, leakage errors are converted to regular errors which can be corrected. In the short term, increase of quantum volume is unlikely to be limited by leakage. In the long-term, leakage mitigation will be a significant part of any quantum computer made from superconducting qubits.

Figure 8:
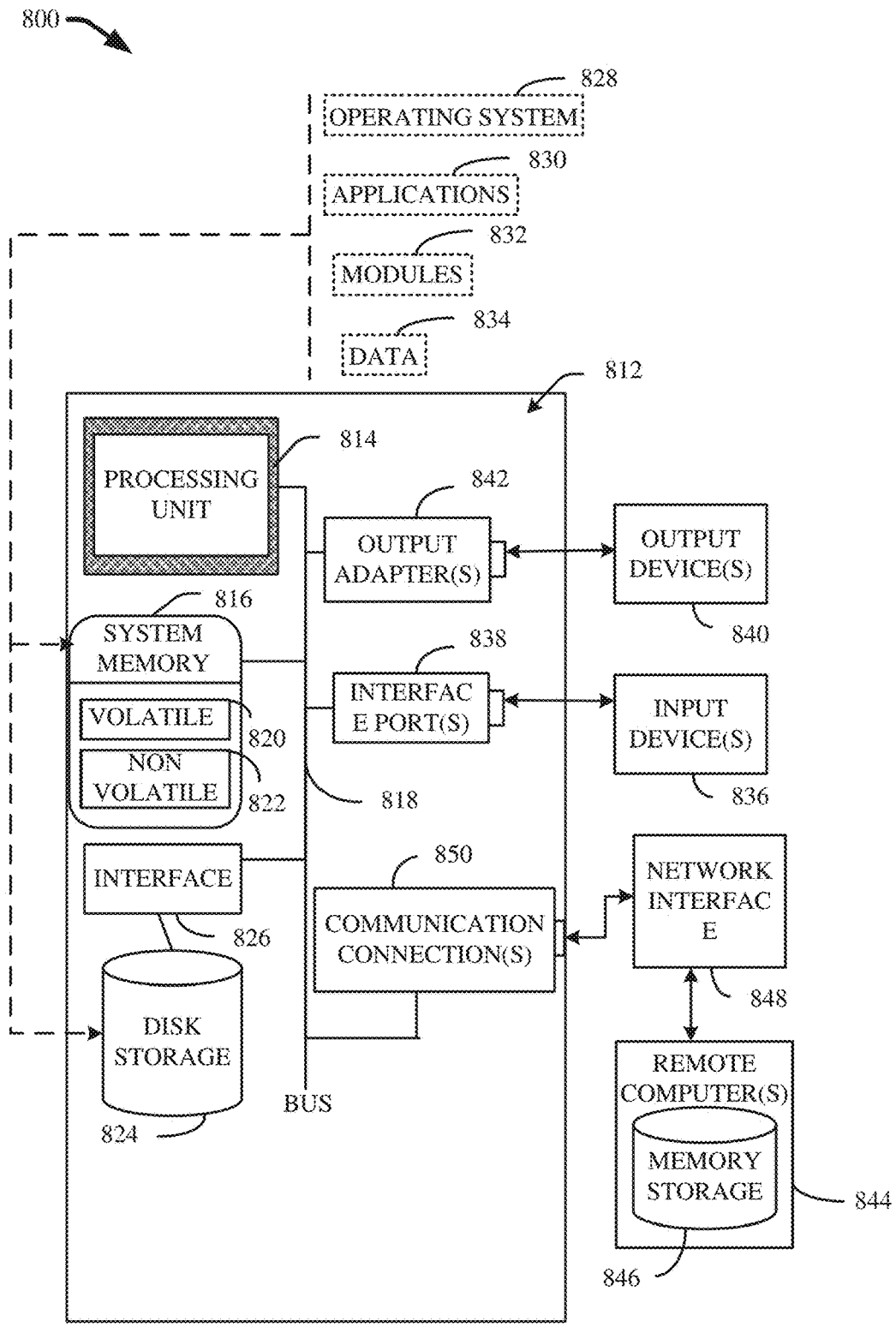
FIG. 8 illustrates a block diagram of an example, non-limiting, operating environment in which one or more embodiments described herein can be facilitated.

In order to provide context for various aspects of the subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and non-volatile memory 822. The basic input/output system (BIOS), containing the basic routines to transfer information between elements within the computer 812, such as during start-up, is stored in non-volatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
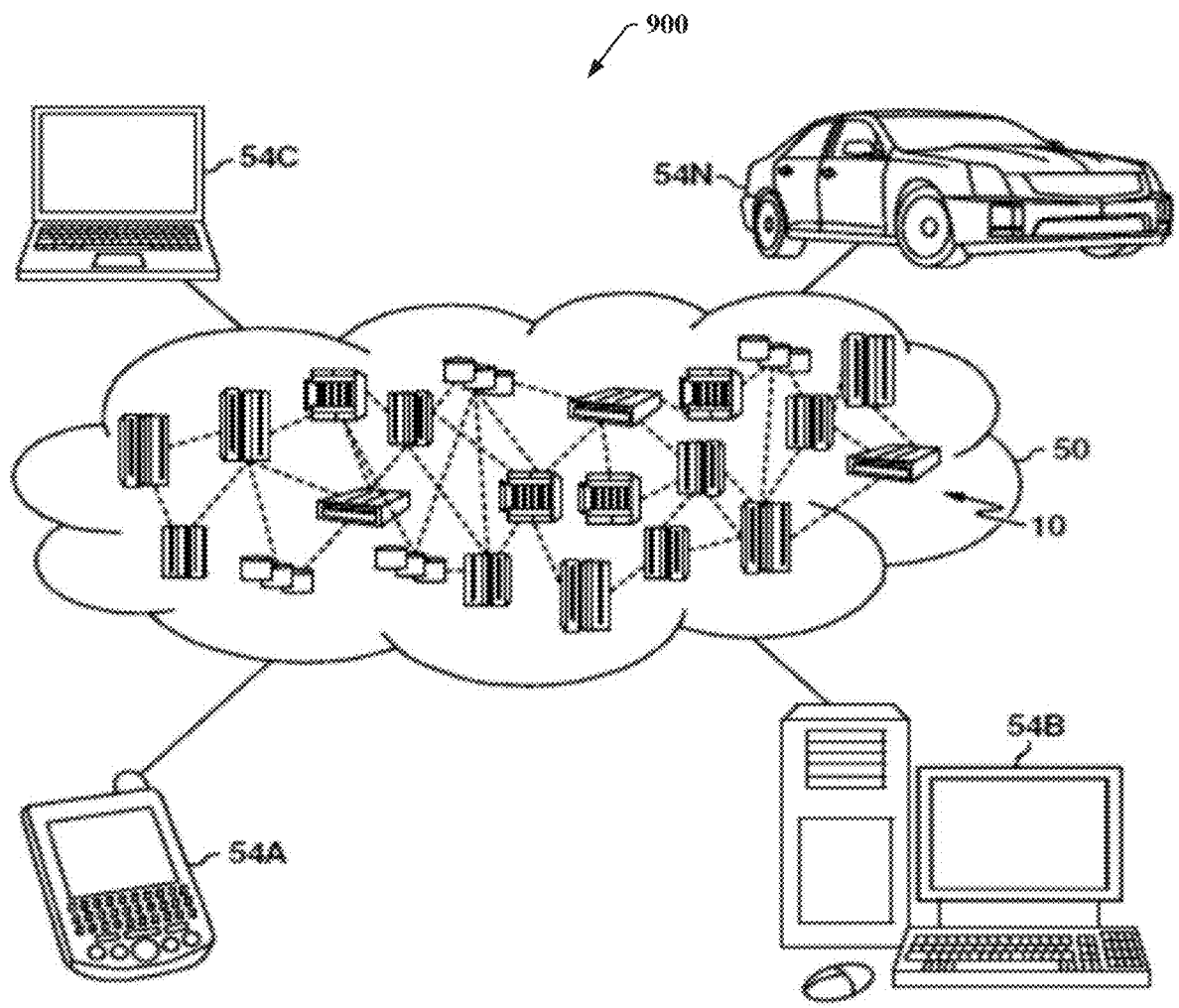
FIG. 9 illustrates a block diagram of an example, non-limiting, cloud computing environment in accordance with one or more embodiments of the subject disclosure.

Referring now to FIG. 9, an illustrative cloud computing environment 950 is depicted. As shown, cloud computing environment 950 includes one or more cloud computing nodes 99 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, etc.) with which local computing devices used by cloud consumers can communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
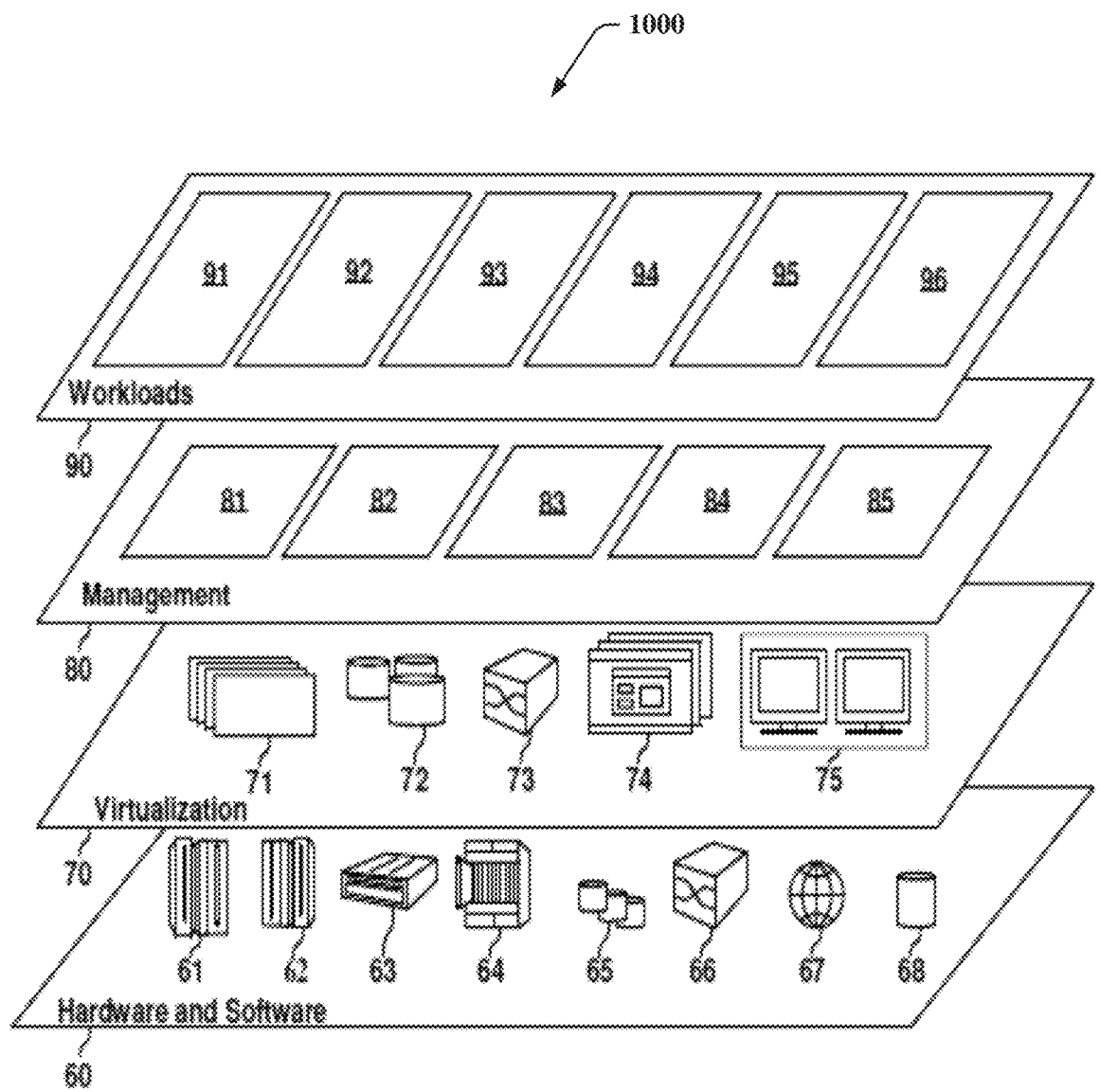
FIG. 10 illustrates a block diagram of example, non-limiting, abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 include hardware and software components. Examples of hardware components include: mainframes 1061; RISC (Reduced Instruction Set Computer) architecture-based servers 1062; servers 1063; blade servers 1064; storage devices 1065; and networks and networking components 1066. In some embodiments, software components include network application server software 1067, quantum platform routing software 1068, and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and quantum state preparation software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It is understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It can also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or non-volatile memory, or can include both volatile and non-volatile memory. By way of illustration, and not limitation, non-volatile memory can include read only memory (ROM), programmable ROM (PROM), electrically programmable ROM (EPROM), electrically erasable ROM (EEPROM), flash memory, or non-volatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a qubit including a qubit transition frequency and multiple qubit leakage transition frequencies; and
a filter circuit coupled to the qubit for leakage mitigation based on the qubit frequency and the multiple qubit leakage transition frequencies, wherein the filter circuit causes the leakage transition frequencies to dissipate while isolating the qubit transition frequency.

2. The system of claim 1, wherein the filter circuit resets a leakage state of the qubit to a qubit subspace on a timescale faster than a natural decay process.

3. The system of claim 1, wherein the filter circuit comprises a coupling capacitor, and a filter coupled to the qubit by the coupling capacitor wherein the filter includes a response characteristic that passes at least one qubit leakage transition frequency to a dissipation channel while blocking the qubit frequency from the dissipation channel.

4. The system of claim 1, wherein the qubit is a transmon that is a type of a superconducting qubit.

5. The system of claim 3, wherein the dissipation is created by is at least one of: a resistor; a lossy capacitor; or a transmission line.

6. The system of claim 3, wherein the coupling is at least one of: direct capacitive coupling, inductive coupling, galvanic coupling, or coupling through a bus.

7. A method, comprising:
selecting, for a qubit, a qubit transition frequency and multiple qubit leakage transition frequencies;
providing leakage mitigation based on the qubit transition frequency and the multiple qubit leakage transition frequencies by utilizing either:

a filter circuit coupled to the qubit that causes leakage transitions to dissipate while isolating the qubit transition frequency; or a tunable, dissipative cavity coupled to the qubit that causes leakage transitions to dissipate while isolating the qubit transition frequency.

8. The method of claim 7, further comprising:

a dedicated electrical circuit that resets a leakage state of the qubit to the qubit subspace on a timescale faster than a natural decay process.

9. The method of claim 8, further comprising:

coupling the leakage state to a dissipation channel while protecting qubit state.

10. The method of claim 7, further comprising passing at least one qubit leakage transition frequency to a dissipation channel while blocking the qubit frequency from the dissipation channel.

11. A system, comprising:

a qubit including a qubit transition frequency and multiple qubit leakage transition frequencies; and a tunable dissipative cavity circuit coupled to the qubit for leakage mitigation based on the qubit frequency and the multiple qubit leakage transition frequencies, wherein the tunable dissipative cavity circuit causes dissipation at the leakage transition frequencies while isolating the qubit transition frequency.

12. The system of claim 11, wherein tunable dissipative cavity includes has a characteristic frequency that is configured to be tuned across the plurality of qubit leakage transition frequencies to a dissipation channel while blocking the qubit frequency from the dissipation channel.

13. The system of claim 12, wherein the tunable cavity comprises a superconducting quantum interference device tunable qubit with a resistor to create dissipation.

14. The system of claim 12, wherein the tunable cavity is a lumped element or a transmission line.

15. The system of claim 12, wherein the dissipation is created as at least one of: on-chip, resistor, lossy capacitor, or off-chip dissipation with an external transmission line.

16. The system of claim 12, wherein the coupler is a is at least one of: direct capacitive coupling, inductive, galvanic, or coupled through a bus.

* * * * *